United States Patent [19]

Durney et al.

[11] 4,249,196

[45] Feb. 3, 1981

[54] INTEGRATED CIRCUIT MODULE WITH INTEGRAL CAPACITOR

[75] Inventors: David J. Durney, Holland, Pa.; James A. Lockhart, Jr., Basking Ridge, N.J.

[73] Assignee: Burroughs Corporation, Detroit, Mich.

[21] Appl. No.: 935,169

[22] Filed: Aug. 21, 1978

[51] Int. Cl.³ .................... H01L 23/02; H01L 23/12; H01L 27/02

[52] U.S. Cl. ........................ 357/74; 357/51; 357/75; 357/80; 174/68.5

[58] Field of Search ............... 357/74, 75, 80, 51; 174/68.5

[56] References Cited

U.S. PATENT DOCUMENTS

| | | | |
|---|---|---|---|
| 2,913,632 | 11/1959 | Stanton | 313/268 |
| 3,323,022 | 5/1967 | Dacosta | 357/75 |
| 3,374,400 | 3/1968 | Tabuchi et al. | 357/80 |
| 3,390,012 | 6/1968 | Haberecht | 357/59 |
| 3,523,039 | 8/1970 | Ramsey | 357/80 |
| 3,535,486 | 10/1970 | Wood | 357/80 |
| 3,555,364 | 1/1971 | Matcovich | 357/75 |
| 3,922,708 | 11/1975 | Crowder et al. | 357/91 |
| 3,943,557 | 3/1976 | Frazee et al. | 357/75 |
| 4,130,722 | 12/1978 | Levijoki | 357/80 |

*Primary Examiner*—Andrew J. James
*Attorney, Agent, or Firm*—Kevin R. Peterson; Robert A. Green; Edward J. Feeney, Jr.

[57] ABSTRACT

The disclosure is of an integrated circuit assembly comprising a base which carries an integrated circuit chip and a cover which protects the chip. The cover has embedded therein a capacitor which has its two leads connected to, or in contact with, two leads on the base when the cover is assembled with the base.

4 Claims, 3 Drawing Figures

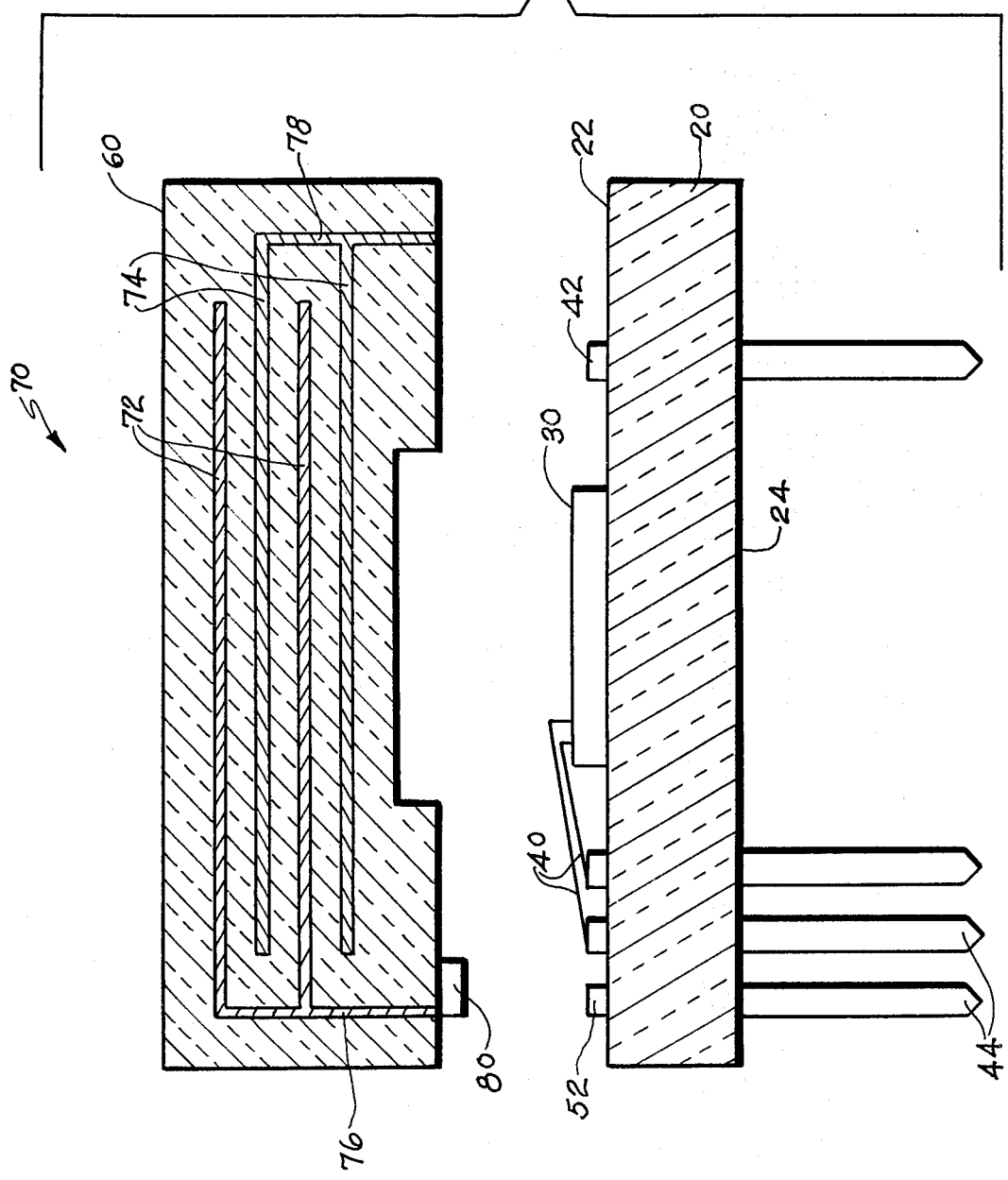

INTEGRATED CIRCUIT MODULE WITH INTEGRAL CAPACITOR

BACKGROUND OF THE INVENTION

It is well known that it is desirable to provide a capacitor in close relationship with an integrated circuit chip to minimize the effects of noise generated by electrical pulses applied during operation of the chip. U.S. Pat. No. 3,880,493 describes one suitable arrangement wherein a capacitor is built into a socket associated with the IC module. This is a satisfactory structure; however, the apparatus of the invention has certain advantages, particularly since it makes it possible to eliminate the IC socket, if desired.

DESCRIPTION OF THE DRAWINGS

FIG. 2 is a sectional view of the apparatus of FIG. 1 partly assembled; and

DESCRIPTION OF THE PREFERRED EMBODIMENTS

Figure 1:
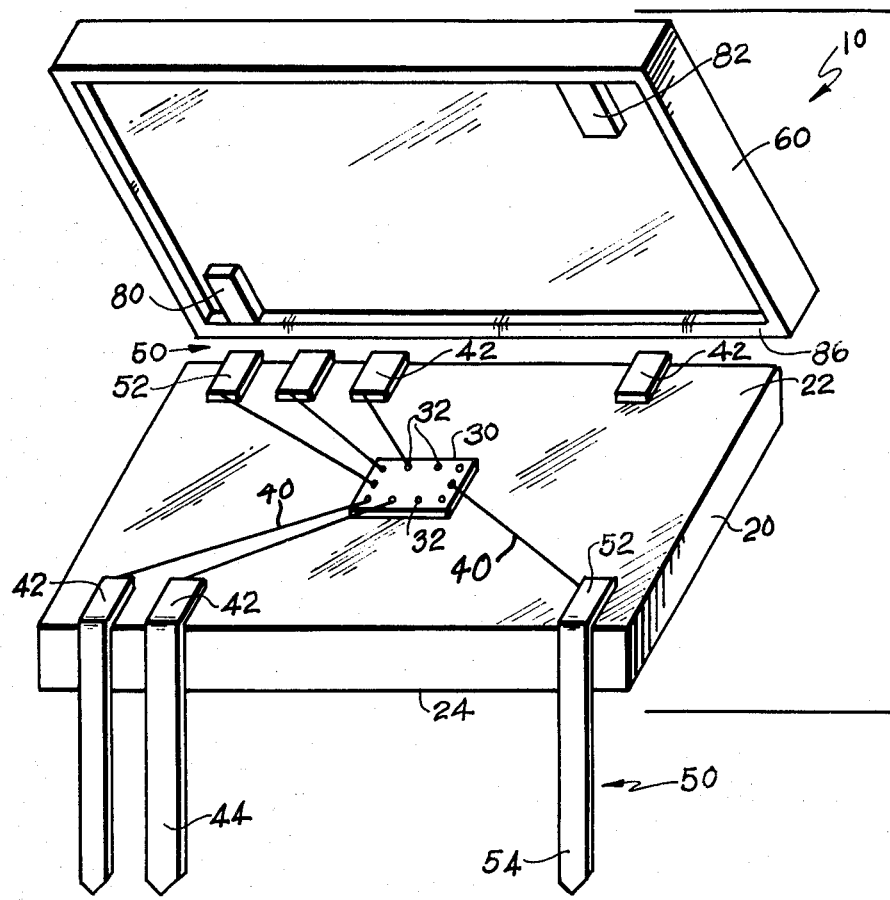
FIG. 1 is an exploded view of the invention.

An integrated circuit (IC) chip or module 10 embodying the invention includes a ceramic base 20 having a top surface 22 and a bottom surface 24. An IC chip 30, having terminals 32, is secured to the top surface 22, along with a lead frame comprising a plurality of leads 40, each of which is suitably connected to one of the output terminals 32 on the IC chip 30. The leads 40 have portions 42 which engage the top surface of the base and external contact portions 44 which extend downwardly therefrom so that they can be inserted into a socket, a printed circuit board, or the like. In addition, two leads 50 are provided at opposite portions of the base, these leads having pads 52 which engage the top surface of the base and depending contact portions 54 for connection, one to the system power supply and one to ground.

The module 10 includes a cover 60 which is also of a ceramic, or any suitable material, which serves as a dielectric medium for a capacitor 70, which is embedded in it. The capacitor 70 is generally of the type shown in U.S. Pat. No. 3,880,493 and is made up of two sets of interleaved metal plates 72 and 74. The plates are as large as possible, and they are as close together as possible, and one set has a lead 76 extending along one end of the cover, and the other set has a common lead 78 extending along the other end of the cover. The leads extend vertically downwardly to the lower surface of the cover where they terminate in contact pads 80 and 82. The pads 80 and 82 are near opposite corners of the lower surface of the cover so that, when the cover and base are assembled, the pads make contact with the pads 52 of leads 50. If desired, or if necessary, spring contacts 84 or the like may be provided between the pads 80-52 and 82-52, as shown in FIG. 3.

Figure 3:
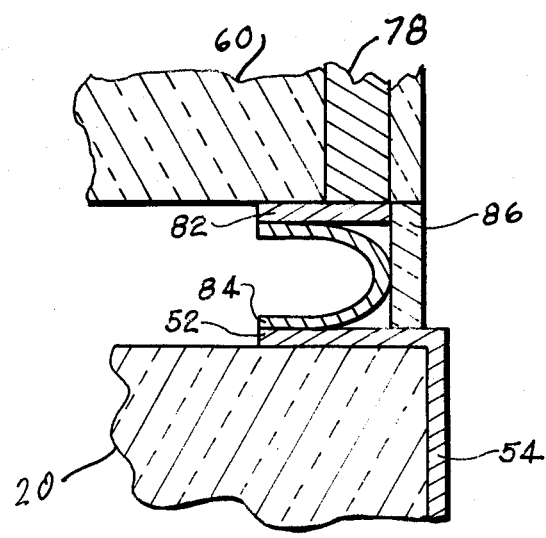
FIG. 3 is a sectional view of a modification of the invention.

The cover and base may be sealed together by means of a glass frit seal, as is well known in the art and as illustrated in FIGS. 1 and 3.

What is claimed is:

1. A semiconductor package comprising
   an insulating substrate carrying an integrated circuit chip, the chip having a plurality of terminals,
   a plurality of contacts secured to said substrate, each having a connection to one of said terminals,
   a cover for said package, said cover including a bottom surface and a top surface, and
   a capacitor embedded in said cover and comprising at least two spaced-apart conductors, each of which is connected to a contact pad on the bottom surface of said cover, each contact pad being positioned to make electrical contact with one of said contacts on said substrate when said cover is in place over said substrate.

2. The package defined in claim 1 wherein said capacitor comprises a plurality of plates which are parallel to and insulated from each other.

3. The package defined in claim 1 wherein said substrate has a top surface, and said chip is secured to said top surface of said substrate.

4. The apparatus defined in claim 1 and including spring contact members between said contact pads and their contacts.

* * * * *